United States Patent
Shin et al.

(10) Patent No.: US 8,378,757 B2
(45) Date of Patent: Feb. 19, 2013

(54) RESONATOR USING CARBON NANO SUBSTANCE AND METHOD OF MANUFACTURING RESONATOR

(75) Inventors: Jea Shik Shin, Hwaseong-si (KR); Seong Chan Jun, Seoul (KR); Yun Kwon Park, Dongducheon-si (KR); In Sang Song, Hwaseong-si (KR); Young Il Kim, Suwon-si (KR); Duck Hwan Kim, Goyang-si (KR); Chul Soo Kim, Hwaseong-si (KR)

(73) Assignees: Samsung Electronics Co., Ltd., Suwon-si (KR); Industry-Academic Cooperation Foundation, Yonsei University, Seoul (KR)

( * ) Notice: Subject to any disclaimer, the term of this patent is extended or adjusted under 35 U.S.C. 154(b) by 0 days.

(21) Appl. No.: 13/105,070

(22) Filed: May 11, 2011

(65) Prior Publication Data

US 2011/0279188 A1    Nov. 17, 2011

(30) Foreign Application Priority Data

May 11, 2010 (KR) .......................... 10-2010-0044062

(51) Int. Cl.
*H03B 5/30* (2006.01)
*H01P 7/10* (2006.01)

(52) U.S. Cl. ..................... 331/154; 331/116 M; 333/186
(58) Field of Classification Search .................. 331/154, 331/116 M; 333/186, 200; 310/309
See application file for complete search history.

(56) References Cited

U.S. PATENT DOCUMENTS

| 3,275,415 | A  | * | 9/1966 | Chang et al. ..................... 117/87 |
| 6,107,168 | A  |   | 8/2000 | Rupp |
| 6,239,418 | B1 |   | 5/2001 | Konig et al. |
| 2008/0029125 | A1 |   | 2/2008 | Olesen et al. |
| 2010/0134207 | A1 | * | 6/2010 | Mohanty et al. ............... 333/186 |

FOREIGN PATENT DOCUMENTS

| JP | 2006-243476 | 9/2006 |
| KR | 10-0394016 | 7/2003 |
| KR | 10-0434272 | 5/2004 |
| KR | 10-2009-0113643 | 11/2009 |

* cited by examiner

*Primary Examiner* — Joseph Chang
(74) *Attorney, Agent, or Firm* — NSIP Law

(57) ABSTRACT

A resonator and a method of manufacturing a resonator are provided. The resonator includes a sacrificial layer formed on a substrate, and a resonant structure formed on the sacrificial layer, the resonant structure comprising a carbon nano-substance layer and a silicon carbide layer.

20 Claims, 6 Drawing Sheets

RESONATOR USING CARBON NANO SUBSTANCE AND METHOD OF MANUFACTURING RESONATOR

CROSS-REFERENCE TO RELATED APPLICATION

This application claims the benefit under 35 U.S.C. §119 (a) of a Korean Patent Application No. 10-2010-0044062, filed on May 11, 2010, in the Korean Intellectual Property Office, the entire disclosure of which is incorporated herein by reference for all purposes.

BACKGROUND

1. Field

The following description relates to a resonator using a carbon nano-substance and a method of manufacturing the resonator.

2. Description of Related Art

As various portable micro-equipment devices are commercialized, it is desirable for sizes of various components used in portable micro-equipment devices to be miniaturized. Recently, to develop microcomponents and ultra light components, various technologies have been suggested, such as Micro Electro-Mechanical system (MEMS) technology capable of designing machinery or equipment having an ultra minute structure of less than several micrometers, or Nano Electro-Mechanical System (NEMS) technology.

When a micro resonator manufactured using NEMS technology is driven in an ideal environment, such as an environment having a cryogenic temperature and an ultra-low pressure, a significant loss of energy may be avoided, a Q value greater than 10,000 may be realized, and low-power driving may theoretically be possible.

However, because most resonators are driven in an ordinary environment, such as an environment having a room temperature and a high pressure, a significant loss of energy may occur due to internal factors (e.g., volume defect and surface defect of an element and surface damage generated in manufacturing and processing) and external factors (e.g., reduction in vibration width due to air friction, coupling loss, and the like).

In addition, a conventional resonator may form a resonant structure using silicon carbide and aluminum. However, in a metal layer such as aluminum, a tensile stress and a compressive stress are different from each other, making it impossible to obtain a high resonant frequency.

SUMMARY

In one general aspect, there is provided a resonator. The resonator includes a sacrificial layer formed on a substrate, and a resonant structure formed on the sacrificial layer, the resonant structure comprising a carbon nano-substance layer and a silicon carbide layer.

The general aspect of the resonator may further provide that the sacrificial layer is formed on the substrate to enable a region of the resonant structure to be spaced apart from the substrate.

The general aspect of the resonator may further provide that the resonant structure has a two-layer structure, including the carbon nano-substance layer, and the silicon carbide layer. The general aspect of the resonator may also further provide that an order of the respective layers of the resonant structure is interchangeable.

The general aspect of the resonator may further provide that the resonant structure has a three-layer structure that is symmetrical with respect to a center portion of the resonant structure in a vertical direction, the three-layer structure including the silicon carbide layer, the carbon nano-substance layer formed on the silicon carbide layer, and an additional carbon nano-substance layer formed under the silicon carbide layer.

The general aspect of the resonator may further provide that the resonant structure has a three-layer structure that is symmetrical with respect to a center portion of the resonant structure in a vertical direction, the three-layer structure including the carbon-nano substance layer, the silicon carbide layer formed on the carbon nano-structure layer, and an additional silicon carbide layer formed under the carbon nano-substance layer.

The general aspect of the resonator may further provide that the carbon nano-substance layer includes graphene, graphite, a Carbon Nano Tube (CNT), or any combination thereof.

The general aspect of the resonator may further provide that the resonant structure has a three-layer structure that is symmetrical with respect to a center portion of the resonant structure in a horizontal direction, the three-layer structure including the silicon carbide layer, the carbon nano-substance layer formed on the silicon carbide layer, and an additional carbon nano-substance layer formed under the silicon carbide layer.

The general aspect of the resonator may further provide that the resonant structure has a three-layer structure that is symmetrical with respect to a center portion of the resonant structure in a horizontal direction, the three-layer structure including the carbon-nano substance layer, the silicon carbide layer formed on the carbon nano-structure layer, and an additional silicon carbide layer formed under the carbon nano-substance layer.

In another aspect, a method of manufacturing a resonator is provided. The method includes forming a sacrificial layer on a substrate, forming a structure on the sacrificial layer, the structure including a carbon nano-substance layer and a silicon carbide layer, forming a resonant structure, including etching the formed structure, and etching the formed sacrificial layer to enable a region of the resonant structure to be spaced apart from the substrate.

The general aspect of the method may further provide that the forming of the structure includes forming a metal layer on a base substrate, forming the carbon nano-substance layer on the metal layer, separating the metal layer and the carbon nano-substance layer from the base substrate, bonding the separated carbon nano-substance layer to with the substrate where the sacrificial layer is formed, exposing the bonded carbon nano-substance layer, including etching the metal layer, and forming the structure, including forming the silicon carbide layer on the exposed carbon nano-substance layer.

The general aspect of the method may further provide that the forming of the structure further includes forming an additional carbon nano-substance layer on the formed silicon carbide layer.

The general aspect of the method may further provide that the forming of the carbon nano-substance layer including mounting, within a quartz tube, the base substrate where the metal layer is formed, heating the mounted base substrate, depositing the carbon nano-substance layer, including injecting a reactive gas mixture including a carbon component into the quartz tube, and cooling the carbon nano-substance layer.

The general aspect of the method may further provide that the forming of the structure includes forming a metal layer on a base substrate, forming the silicon carbide layer on the metal layer, separating the metal layer and the silicon carbide layer from the substrate, bonding the separated silicon carbide layer to with the substrate where the sacrificial layer is formed, exposing the bonded silicon carbide layer, including etching the metal layer, and forming the structure, including forming the carbon nano-substance layer on the exposed silicon carbide layer.

The general aspect of the method may further provide that the forming of the structure further includes forming an additional silicon carbide layer on the formed carbon nano-substance layer.

The general aspect of the method may further provide that the carbon nano-substance layer includes graphene, graphite, a Carbon Nano Tube (CNT), or any combination thereof.

In another aspect, a method of manufacturing a resonator is provided. The method includes forming a sacrificial layer on a substrate, and forming a resonant structure on the sacrificial layer, the resonant structure including a carbon nano-substance layer and a silicon carbide layer.

The general aspect of the method may further provide that the forming of the resonant structure includes forming a two-layer structure including the carbon nano-substance layer and the silicon carbide layer. The general aspect of the method may also further provide that an order of the respective layers of the resonant structure is interchangeable.

The general aspect of the method may further provide that the forming of the resonant structure includes forming a two-layer structure including the carbon nano-substance layer and the silicon carbide layer. The general aspect of the method may also further provide that an order of the respective layers of the resonant structure is interchangeable.

The general aspect of the method may further provide that the forming of the resonant structure includes forming a three-layer structure to be symmetrical to a center portion of the resonant structure in a vertical direction, the forming of the three-layer structure including forming the carbon nano-substance layer on the silicon carbide layer, and forming an additional carbon nano-substance layer under the silicon carbide layer.

The general aspect of the method may further provide that the forming of the resonant structure includes forming a three-layer structure to be symmetrical to a center portion of the resonant structure in a vertical direction, the forming of the three-layer structure including forming the silicon carbide layer on the carbon nano-structure layer, and forming an additional silicon carbide layer under the carbon nano-structure layer.

The general aspect of the method may further provide that the carbon nano-substance layer includes graphene, graphite, a Carbon Nano Tube (CNT), or any combination thereof.

The general aspect of the method may further provide that the silicon carbide layer includes a thin film deposit.

The general aspect of the method may further provide that the forming of the resonant structure includes forming a three-layer structure to be symmetrical to a center portion of the resonant structure in a horizontal direction, the forming of the three-layer structure including forming the carbon nano-substance layer on the silicon carbide layer, and forming an additional carbon nano-substance layer under the silicon carbide layer.

The general aspect of the method may further provide that the forming of the resonant structure includes forming a three-layer structure to be symmetrical to a center portion of the resonant structure in a horizontal direction, the forming of the three-layer structure includes forming the silicon carbide layer on the carbon nano-structure layer, and forming an additional silicon carbide layer under the carbon nano-structure layer.

Other features and aspects may be apparent from the following detailed description, the drawings, and the claims.

Figure 1:
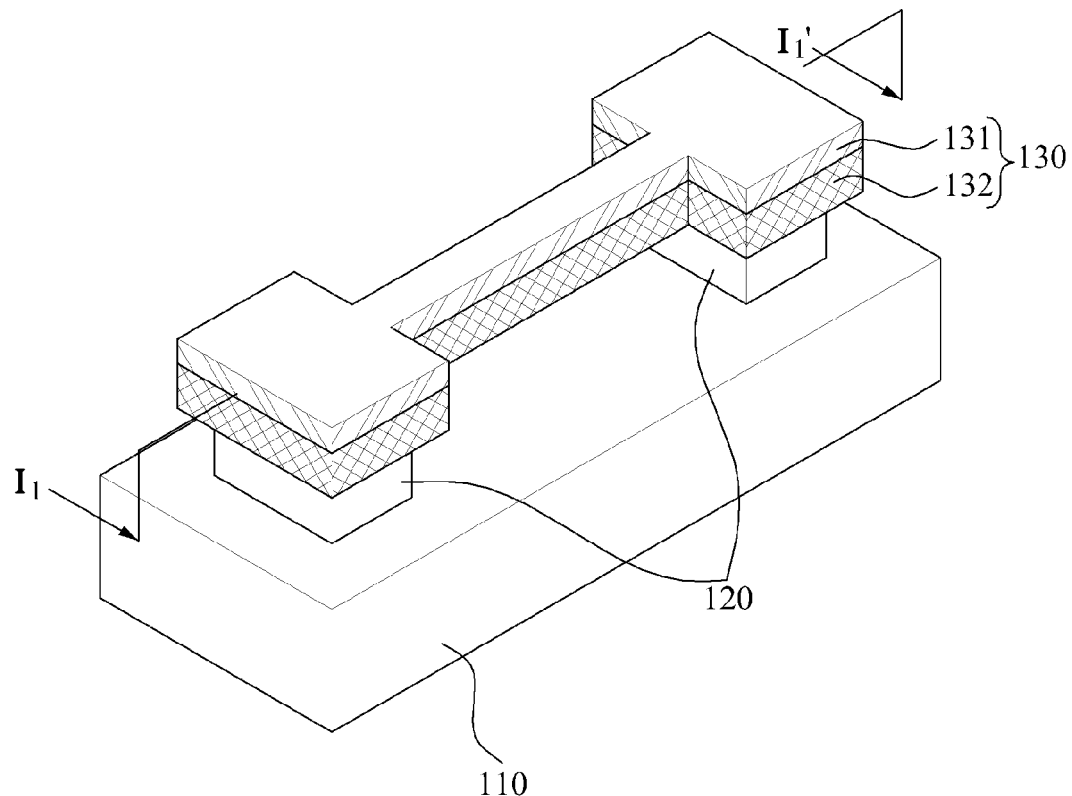
FIG. 1 is a perspective view illustrating an example of a structure of a resonator.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses, and/or methods described herein will be suggested to those of ordinary skill in the art. In addition, description of well-known functions and constructions may be omitted for increased clarity and conciseness.

It is understood that the features of the present disclosure may be embodied in different forms and should not be constructed as limited to the example embodiment(s) set forth herein. Rather, embodiment(s) are provided so that this disclosure will be thorough and complete, and will convey the full scope of the present disclosure to those skilled in the art. The drawings may not be necessarily to scale, and, in some instances, proportions may have been exaggerated in order to clearly illustrate features of the embodiment(s). When a first layer is referred to as being "on" a second layer or "on" a substrate, it may not only refer to a case where the first layer is formed directly on the second layer or the substrate but may also refer to a case where a third layer exists between the first layer and the second layer or the substrate.

FIG. 1 is a perspective view illustrating an example of a structure of a resonator. Referring to FIG. 1, a resonator 100 includes a sacrificial layer 120 and a resonant structure 130 formed on a substrate 110.

According to the example illustrated in FIG. 1, the sacrificial layer 120 is formed on the substrate 110 to provide support for the resonant structure 130 and insulation between the substrate 110 and the resonant structure 130. In addition, the sacrificial layer 120 may be formed on only a predetermined region of the substrate 110 instead of being formed on an entire front surface of the substrate 110. Further, the sacrificial layer 120 may have an air gap to enable a region of the resonant structure 130 to be spaced apart from the substrate 110. Accordingly, the sacrificial layer 120 may provide support for both sides of a resonant structure 130 having a doubly clamped beam structure.

The resonant structure 130 is formed on the sacrificial layer 120, and includes at least one carbon nano-substance layer and at least one silicon carbide layer. In the example illustrated in FIG. 1, the resonant structure 130 includes a carbon nano-substance layer 132 and a silicon carbide layer 131. The carbon nano-substance layer 132 of the example illustrated in FIG. 1 is formed on the sacrificial layer 120, and the silicon carbide layer 131 is formed on the carbon nano-substance layer 132. In addition, the resonant structure 130 may have a two-layer structure, one layer of the two-layer structure being a carbon nano-substance layer and another layer of the two-layer structure being a silicon carbide layer, an order of the respective layers being interchangeable.

The carbon nano-substance layer 132 may include graphene, graphite, a Carbon Nano Tube (CNT), or any combination thereof. Accordingly, improved mechanical and electrical properties may result from the inclusion of the carbon nano-substance layer 132 in the resonant structure 130.

As an example, the resonant structure 130 may have a resonant frequency of approximately one terahertz (1 THz) due to the inclusion of the carbon nano-substance layer 131 and the silicon carbide layer 132 in the resonant structure 130.

The resonant frequency of the resonant structure 130 may increase in a light and solid material, and may increase along with a reduction in a length (l) of the resonant structure 130 and an increase in a width (w) of a vibration direction.

In various aspects, the silicon carbide layer 132 may include a thin film deposit. Since the silicon carbide layer 132 may be a light and solid material, the resonant frequency of the resonant structure 130 may increase.

Figure 2:
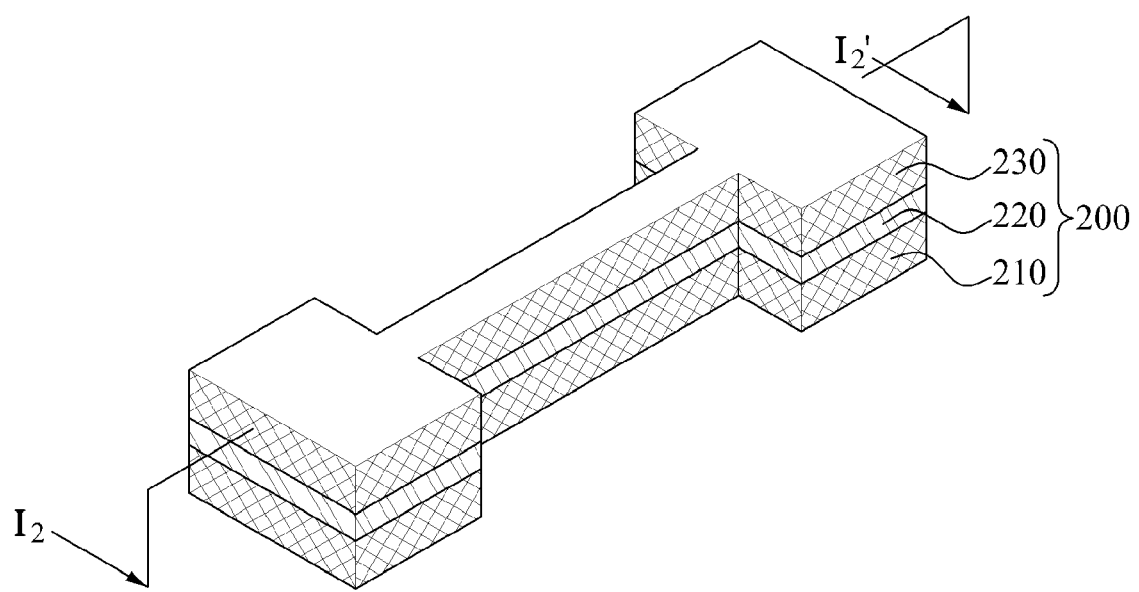
FIG. 2 is a perspective view illustrating an example of a resonant structure.

FIG. 2 is a perspective view illustrating an example of a resonant structure.

As illustrated in FIG. 2, the resonant structure 200 includes a stacked structure, and, thus, differs from the resonant structure 130 of FIG. 1. Further, similar to the resonant structure 130 of FIG. 1, the resonant structure 200 may be formed as a resonant on a substrate where a sacrificial layer is formed.

Unlike the resonant structure 130 having a two-layer structure, the example of the resonant structure 200 illustrated in FIG. 2 has a three-layer structure. As is illustrated in FIG. 2, the silicon carbide layer 220 of the resonant structure 200 is placed between two carbon nano-substance layers 210 and 230. Accordingly, the resonant structure 200 may have a three-layer structure that is symmetrical with respect to a center portion of a vertical direction. As such, during resonance, vibration of the resonant structure 200 may occur due to the symmetrical structure. As a result, a driving of a resonator incorporating the resonant structure 200 may be stable.

In addition, the resonant structure 200 may have a doubly clamped beam structure, and may be vertically or horizontally symmetrical with respect to the center portion of the vertical direction. Accordingly, energy losses because of asymmetry in a vertical direction and a horizontal direction may be reduced, which, in turn, may enable the achievement of a high Q value.

By including the silicon carbide layer 220, the resonant structure 200 having the aforementioned doubly clamped beam structure may obtain a high resonant frequency.

The resonant frequency may be obtained using the following Table 1 and Equation 1.

Table 1 indicates examples of physical property values with respect to silicon carbide, silicon, and gallium arsenide.

TABLE 1

|  | Silicon carbide | Silicon | Gallium arsenide |
| --- | --- | --- | --- |
| E: Young's Modulus, GPa | 410 | 150 | 85.5 |
| ρ (density, kg/m³) | 3200 | 2330 | 5320 |
| E/ρ | 0.128 | 0.064 | 0.016 |

$$f_0 = 1.03 \frac{w}{L^2} \sqrt{\frac{E}{\rho}} \qquad \text{[Equation 1]}$$

In Equation 1, w denotes a width of a resonant structure (beam region), L denotes a length of the resonant structure (beam region), E denotes Young's Modulus, and ρ denotes a density. When applying the Table 1 examples of the silicon carbide, silicon, and gallium arsenide physical property values to Equation 1, a resonant frequency as shown in the following Table 2 is obtained.

TABLE 2

| | Resonant (beam region) size (L × w × t) of Resonator | | | |
| --- | --- | --- | --- | --- |
| | 100 × 3 × 0.1 | 10 × 0.2 × 0.14 | 1 × 0.05 × 0.05 | 0.1 × 0.01 × 0.01 |
| resonant frequency (doubly-clamped beam structure information) | 120/77/42 KHz | 12/7.7/4.2 MHz | 590/380/205 MHz | 12/7.7/4.2 GHz |

In Table 2, examples of the four resonators are shown with respect to resonant size. The respective resonant frequencies of the four resonators are organized according to the respective order of silicon carbide, silicon, and gallium arsenide. As for the sizes of the four resonators, the resonant frequency is shown to be high in an example using silicon carbide. For example, silicon carbide may have a relatively high Young's Modulus and a relatively low density (ρ) in comparison with silicon or gallium arsenide. As a result, a resonator incorporating the use of silicon carbide may have a high resonant frequency. In one general aspect, the silicon carbide layer 220 of the resonant structure 200 of FIG. 2 may include or consist of a silicon carbide substance in order to implement a high resonant frequency.

The carbon nano-substance layers 210 and 230 may include graphene, graphite, a CNT, or any combination thereof. Carbon nano substances such as graphene, graphite, and the CNT have a low Van der Waal's Force in view of molecular structure. Accordingly, the resonant structure 200 of a nano-size unit may be stably and effectively driven.

For example, graphene may include allotropes of carbon created to form a comb-shaped lattice structure of carbon atoms, and nano materials of a thin film type. By means of the lattice structure, electrons of the graphene may be moved 100 times faster than a single crystal used in a semiconductor may be moved. As a result, graphene may have excellent electrical conductivity properties.

By obtaining the physical property values of each of the materials included in the resonant structure, characteristics of each of the materials may be compared. The physical property values of each of the materials may include Young's Modulus and a density, and may be obtained through the following Equations 2 and 3.

$$E = \frac{E_1 A_1 + E_2 A_2}{A_1 + A_2} \quad \text{[Equation 2]}$$

$$\rho = \frac{\rho_1 A_1 + \rho_2 A_2}{A_1 + A_2} \quad \text{[Equation 3]}$$

Equation 2 may be used to obtain the Young's Modulus (E). In Equation 2, $E_1$ denotes a Young's Modulus of a first material, $A_1$ denotes a cross-sectional area of a layer consisting of the first material, $E_2$ denotes a Young's Modulus of a second material, and $A_2$ denotes a cross-sectional area of a layer consisting of the second material.

In addition, Equation 3 may be used to obtain a density ($\rho$). In Equation 3, $\rho_1$ denotes a density of a first material, $A_1$ denotes a cross-sectional area of a layer consisting of the first material, $\rho_2$ denotes a Young's Modulus of a second material, and $A_2$ denotes a cross-sectional area of a layer consisting of the second material.

In Equations 2 and 3, cross-sectional areas $A_1$ and $A_2$ may also indicate a thickness.

When a thickness of the carbon nano-substance layers 210 and 230 consisting of graphene is in a range of 0.3 nm to 0.4 nm, Young's Modulus may be approximately one terapascal (1 TPa). When Young's Modulus is approximately 1 TPa in a resonant structure including the silicon carbide layer and an aluminum layer, Young's Modulus may be approximately fourteen times greater than a Young's modulus of the aluminum layer, which is approximately seventy gigapascals (70 GPa).

Also, in Equation 2, when assuming that $E_1$ is the silicon carbide layer of the resonant structure and $E_2$ is the aluminum layer of the resonant structure, Young's Modulus E of the resonant structure may be approximately two-thirds of a Young's Modulus of a resonant structure only consisting of the above-referenced silicon carbide layer, even though a thickness of the silicon carbide layer is approximately half of a thickness of the aluminum layer.

For example, if the aluminum layer is included in the resonant structure, the Young's Modulus of the resonant structure may be reduced by approximately 300 GPa from approximately 410 GPa, which is the Young's Modulus obtained in a resonant structure only consisting of the silicon carbide layer. This reduction caused by the inclusion of the aluminum layer in the resonant structure results in a loss of energy.

However, in FIG. 2, the Young's Modulus of the resonant structure 200 including the carbon nano-substance layers 210 and 230 consisting of graphene and the silicon carbide layer 220 is approximately 420 GPa, and may be somewhat similar to the above-referenced approximate Young's Modulus of the silicon carbide layer 220 due to a relatively thin thickness of the graphene. Accordingly, the resonant structure 200 including the carbon nano-substance layers 210 and 230 and the silicon carbide layer 220 has a loss of energy that is significantly reduced in comparison with the aforementioned resonant structure that includes the silicon carbide layer and the aluminum layer.

In the example illustrated in FIG. 2, the resonant structure 200 is formed such that the carbon nano-substance layers 210 and 230 are respectively stacked on and placed under a single silicon carbide layer 220. However, the resonant structure 200 may have a three-layer structure where silicon carbide layers are respectively stacked on and placed under a single carbon nano-substance layer.

Figure 3A:
FIGS. 3A to 3D are cross-sectional views illustrating examples of a resonant structure.
Figure 3B:
Figure 3C:
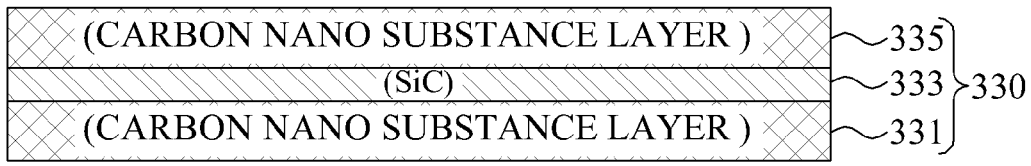
Figure 3D:
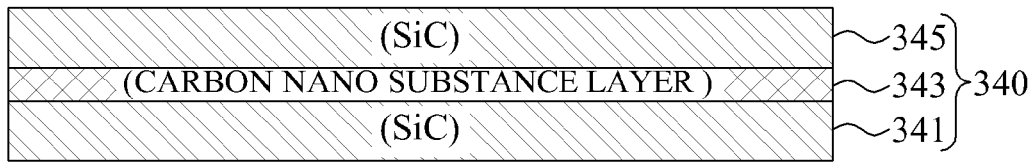

FIGS. 3A to 3D are cross-sectional views illustrating examples of a resonant structure. In FIGS. 3A and 3B, the resonant structures 310 and 320 having a two-layer structure are respectively illustrated. In FIGS. 3C and 3D, the resonant structures 330 and 340 having a three-layer structure are respectively illustrated.

Referring to the example illustrated in FIG. 3A, a resonant structure 310 has the two-layer structure including a single carbon nano-substance layer 311 and a single silicon carbide (SiC) layer 313. In this illustrated example, the SiC layer 313 is formed on the carbon nano-substance layer 311, and may have a cross-sectional view that corresponds with the cross-sectional view taken along the I-I' line in the resonant structure 130 illustrated in FIG. 1.

Referring to the example illustrated in FIG. 3B, a resonant structure 320 includes a single carbon nano-substance layer 323 and a SiC layer 321. Unlike the resonant structure 310 illustrated in FIG. 3A, the carbon nano-substance layer 323 illustrated in FIG. 3B is formed on the SiC layer 321. For example, the resonant structures 310 and 320 having the two-layer structure include a single carbon nano-substance layer and a single silicon carbide layer with an order of the respective layers being interchangeable.

Referring to the example illustrated in FIG. 3C, a resonant structure 330 includes a three-layer structure where a SiC layer 333 is placed between two carbon nano-substance layers 331 and 335. For example, the carbon nano-substance layers 331 and 335 are respectively stacked on and placed under the SiC layer 333. As a result, the three-layer structure is symmetrical with respect to a center portion of the resonant structure 330 in a vertical direction.

The resonant structure 330, of which an example is illustrated in FIG. 3C, may have the same cross-sectional view as the cross-sectional view taken along the $I_2$-$I_2'$ line of the resonant structure 200 illustrated in FIG. 2.

Referring to the example illustrated in FIG. 3D, a resonant structure 340 includes a three-layer structure where a carbon nano-substance layer 343 is placed between two SiC layers 341 and 345. For example, the SiC layers 341 and 345 are respectively stacked on and placed under the carbon nano-substance layer 343. As a result, the three-layer structure is symmetrical with respect to a center portion of the resonant structure 340 in a vertical direction.

FIGS. 4A to 4F are cross-sectional views illustrating an example of a method of manufacturing a resonator.

Figure 4A:
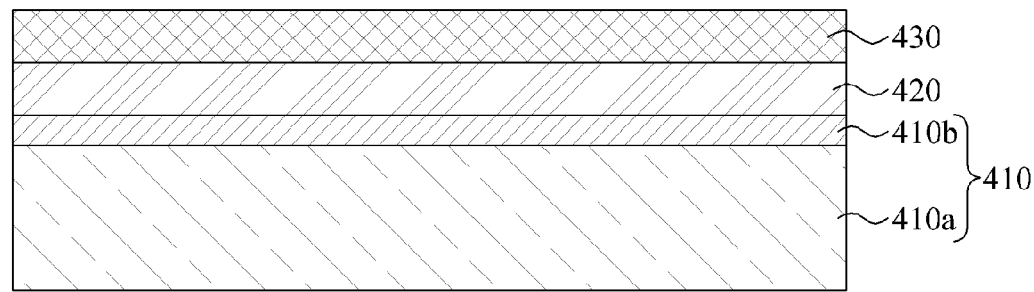
FIGS. 4A to 4F are cross-sectional views illustrating an example of a method of manufacturing a resonator.

Referring to the example illustrated in FIG. 4A, a resonator is manufactured such that a metal layer 420 and a carbon nano-substance layer 430 are sequentially formed on a base substrate 410 including a silicon substrate 410a and an insulation layer 410b made from $SiO_2$. For example, a thickness of 300 nm or less of nickel (Ni) may be deposited on the base substrate 410, using an electron (E) beam evaporator to thereby form the metal layer 420.

The metal layer 420 formed on the base substrate 410 may be mounted within a quartz tube, so that a carbon nano-substance layer 430 may be formed on the metal layer 420. For example, the base substrate 410 where the metal layer 420 is formed may be mounted within the quartz tube to be heated to 1000° C., and an amount of 1 $cm^3$/min of a reactive gas mixture ($CH_4$:$H_2$:Ar=50:62:200) may be injected into the quartz tube to thereby form the carbon nano-substance layer 430.

Next, argon (Ar) may be injected into the quartz tube in a ratio of up to 10° C./S to be quickly cooled to 25° C., so that the carbon nano-substance layer 430 may be prevented from being formed as a multi-layer and readily separated from the metal layer 420 in a subsequent process.

Figure 4B:
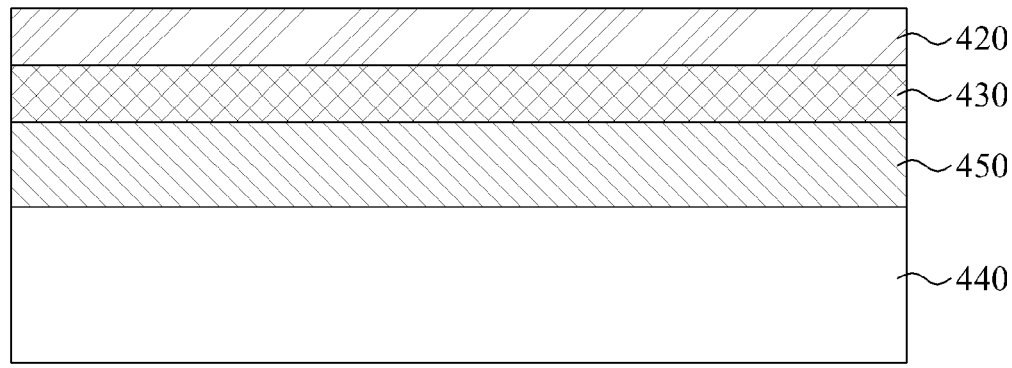

Next, as illustrated in FIG. 4B, the metal layer 420 and the carbon nano-substance layer 430 are separated from the base substrate 410, and moved to a substrate 440 where a sacrificial layer 450 is formed. For example, to separate the metal layer 420 and the carbon nano-substance layer 430 from the base substrate 410, a structure as provided in the example illustrated in FIG. 4A may be immersed in an etching solution, such as Buffered Oxide Etch (BOE) or Hydrogen Fluoride (HF), to enable the insulation layer 410b made from $SiO_2$ to be etched. Accordingly, the metal layer 420 and the carbon nano-substance layer 430 may be separated from the base substrate 410 and floated on etching solution interface. The separated metal layer 420 and carbon nano-substance layer 430 are bonded together so that the carbon nano-substance layer 430 may be bonded on the substrate 440 where the sacrificial layer 450 is formed.

Figure 4C:
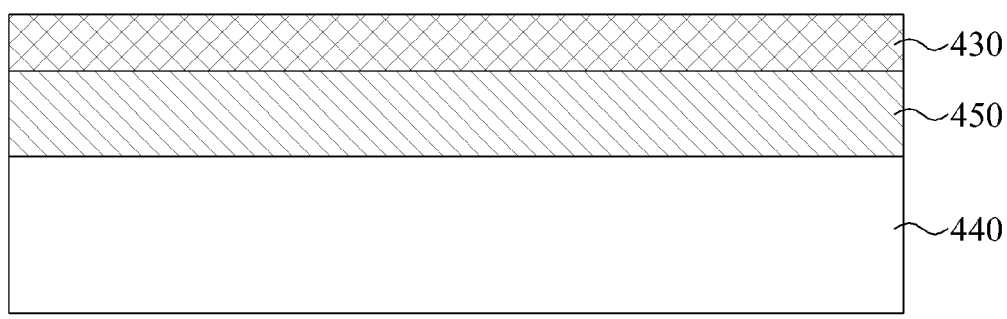

Next, as illustrated in FIG. 4C, the metal layer 420 may be etched to expose the carbon nano-substance layer 430.

In addition to the above-described method, a method of separating the carbon nano-substance layer 430 from the base substrate 410 while being bonded to the base substrate 410 by the metal layer 420 may be performed as follows.

Figure 4D:
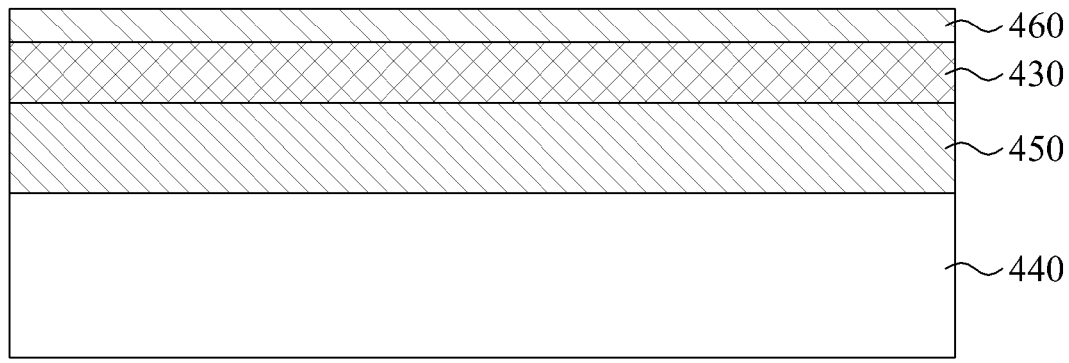
Figure 4E:
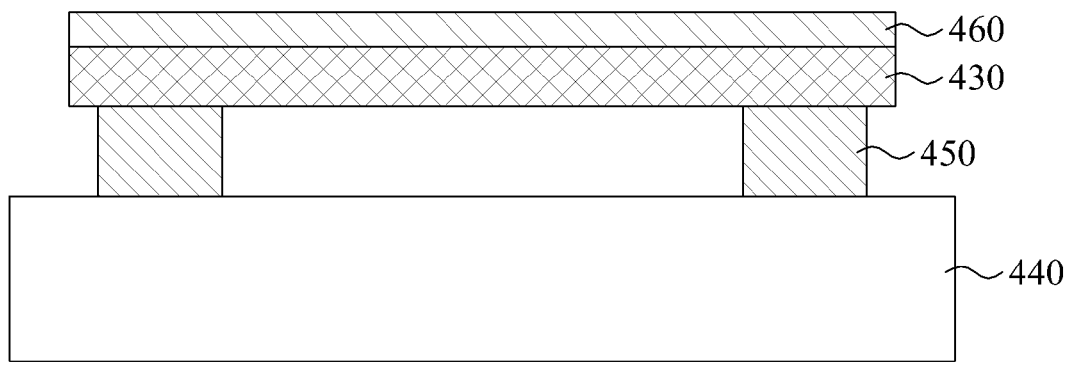
Figure 4F:
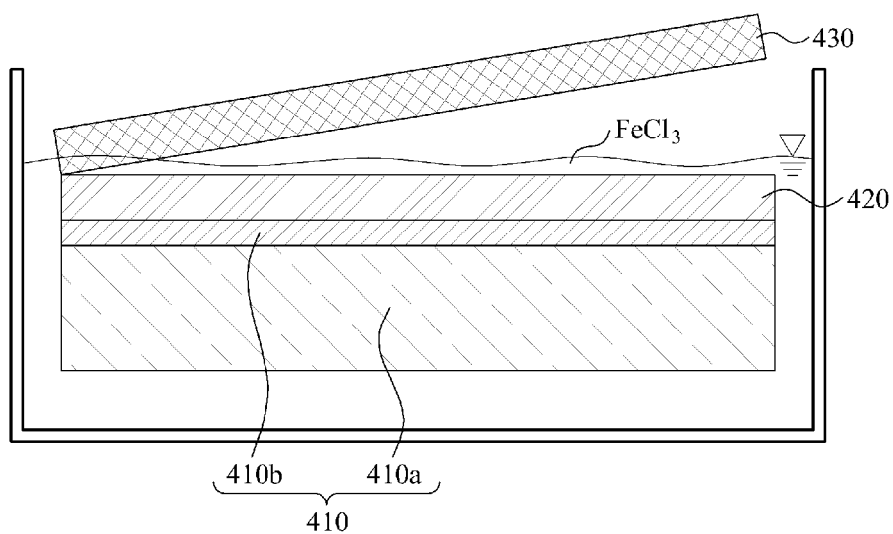

As illustrated in FIG. 4F, the structure illustrated in FIG. 4A may be immersed in an etching solution of iron chloride ($FeCl_3$) to enable the metal layer 420 to be etched, which is an etching method using a redox reaction. Using the etching method, the metal layer 420 may be slowly removed in an etching solution of $FeCl_3$, which is an etching solution having a pH range that stimulates a slower etching of the metal layer 420. As a result, the carbon nano-substance layer 430 may be separated from the metal layer 420 and the base substrate 410.

Next, when the carbon nano-substance layer 430 is exposed, the silicon carbide layer 460 is formed on the carbon nano-substance layer 430, thereby forming the structure illustrated in FIG. 4D.

Specifically, the silicon carbide layer 460 may be deposited on the carbon nano-substance layer 430 through an Atmospheric Pressure Chemical Vapor Deposition (APCVD) using gases such as silane ($SiH_4$), propane ($C_3H_8$), hydrogen ($H_2$), and the like.

Next, as illustrated in FIG. 4E, the structure illustrated in FIG. 4D is etched to form a resonant structure, and the sacrificial layer 450 is etched to enable a region of the resonant structure to be spaced apart from the substrate 440 by a predetermined distance.

For example, a photosensitive substance may be spin-coated on the carbon nano-substance layer 430. Then, a pattern may be formed using an E-beam. In this manner, the carbon nano-substance layer 430 and the silicon carbide layer 460 may be patterned to form a resonant structure having a doubly clamped beam structure.

Next, a region of the sacrificial layer 450 may be etched via a Reactive Ino Etching (RIE). For example, as illustrated in FIG. 4E, a lower area of the resonant structure and the sacrificial layer 450 is etched. Accordingly, the sacrificial layer 450 may be placed on only a lower portion of a fixed area of the resonant structure, and may support both ends of the resonant structure having the doubly clamped beam structure.

Using the method illustrated in FIGS. 4A to 4E, the resonator 100 of FIG. 1 may be manufactured. In addition, the carbon nano-substance layer 430 and silicon carbide layer 460 illustrated in FIGS. 4A to 4E may be switched with each other. In this manner, the resonator may include the resonant structure 320 illustrated in FIG. 3B.

Further, with respect to the examples illustrated in FIGS. 4A and 4E, the described manufacturing process conditions are merely examples, and the claims that follow are not limited thereto. Thus, the manufacturing process conditions may be changed as necessary.

Figure 5A:
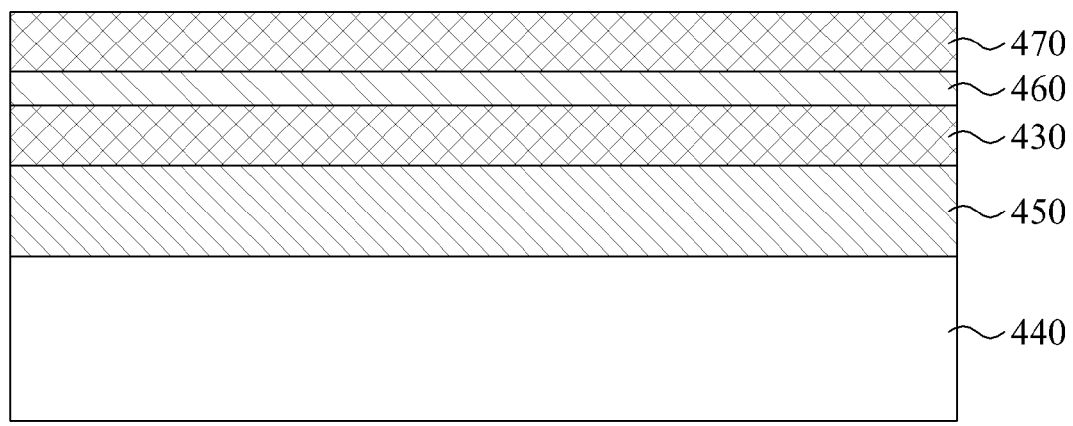
FIGS. 5A to 5B are cross-sectional views illustrating another example of a method of manufacturing a resonator.
Figure 5B:
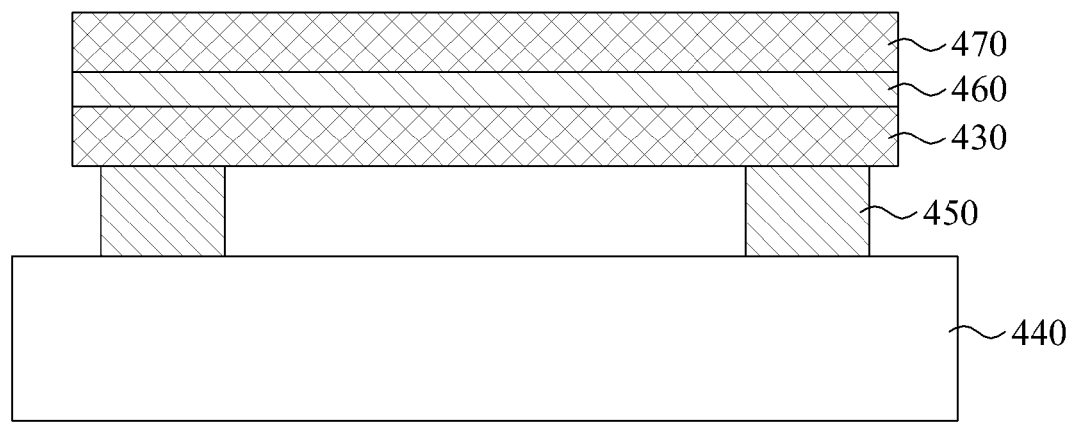

FIGS. 5A to 5B are cross-sectional views illustrating another example of a method of manufacturing a resonator.

In the examples illustrated in FIGS. 5A and 5B, a resonator including a resonant structure having a three-layer structure is described. A process of manufacturing the structure used to form the resonant structure may be the same as that in the examples illustrated in FIGS. 4A to 4D, except that the carbon nano-substance layer 470 is further formed on the silicon carbide layer 460.

For example, as illustrated in FIG. 5A, the carbon nano-substance layer 470 is further formed on the silicon carbide layer 460, thereby forming a three-layer structure including the carbon nano-substance layer 430, the silicon carbide layer 460, and the carbon nano-substance layer 470. Here, a method of forming the carbon nano-substance layer 470 may be the same as the method of forming the carbon nano-substance layer 430 of FIG. 4A.

Next, as illustrated in FIG. 5B, the structure may be etched to form a resonant structure, and the sacrificial layer 450 may be etched to enable a region of the resonant structure to be spaced apart from the substrate 440. Using the manufacturing method illustrated in FIGS. 4A to 4D and FIGS. 5A and 5B, the resonant structure 200 of the example illustrated in FIG. 2 may be manufactured.

A number of examples have been described above. Nevertheless, it will be understood that various modifications may be made. For example, suitable result may be achieved if the described techniques are performed in a different order and/or components described herein are combined in a different manner and/or replaced or supplement by other components or their equivalents. Accordingly, other implementations are within the scope of the following claims.

What is claimed is:

1. A resonator, comprising:
   a sacrificial layer on a substrate; and
   a resonant structure on the sacrificial layer, the resonant structure comprising three layers comprising one or more carbon nano-substance layers and one or more silicon carbide layers.

2. The resonator of claim 1, wherein the sacrificial layer is formed on the substrate to enable a region of the resonant structure to be spaced apart from the substrate.

3. The resonator of claim 1, wherein the three layers are structured symmetrically with respect to a center portion of the resonant structure in a vertical direction, the symmetrically structured three layers comprising a first of the carbon nano-substance layers on the sacrificial layer, one of the silicon carbide layers on the first of the carbon nano-substance layers, and a second of the carbon nano-substance layers on the one of the silicon carbide layers.

4. The resonator of claim 1, wherein the three layers are structured symmetrically with respect to a center portion of the resonant structure in a vertical direction, the symmetrically structured three layers comprising a first of the silicon carbide layers on the sacrificial layer, one of the carbon nano-substance layers on the first of the silicon carbide layers, and a second of the silicon carbide layers on the one of the carbon nano-substance layers.

5. The resonator of claim 1, wherein the carbon nano-substance layers comprise graphene, graphite, a Carbon Nano Tube (CNT), or any combination thereof.

6. The resonator of claim 1, wherein the three layers are structured symmetrically with respect to a center portion of the resonant structure in a horizontal direction, the symmetrically structured three layers comprising a first of the carbon nano-substance layers on the sacrificial layer, one of the silicon carbide layers on the first of the carbon nano-substance layers, and a second of the carbon nano-substance layers on the one of the silicon carbide layers.

7. The resonator of claim 1, wherein the three layers are structured symmetrically with respect to a center portion of the resonant structure in a horizontal direction, the symmetrically structured three layers comprising a first of the silicon carbide layers on the sacrificial layer, one of the carbon nano-substance layers on the first of the silicon carbide layers, and a second of the silicon carbide layers on the one of the carbon nano-substance layers.

8. A method of manufacturing a resonator, the method comprising:
    forming a sacrificial layer on a substrate;
    forming a structure on the sacrificial layer, the structure comprising three layers comprising one or more carbon nano-substance layers and one or more silicon carbide layers;
    forming a resonant structure, comprising etching the formed structure; and
    etching the formed sacrificial layer to space a region of the resonant structure apart from the substrate.

9. The method of claim 8, wherein the forming of the structure comprises forming a metal layer on a base substrate, forming a first of the carbon nano-substance layers on the formed metal layer, separating the formed metal layer and formed first of the carbon nano-substance layers from the base substrate, bonding the separated first of the carbon nano-substance layers to the formed sacrificial layer, exposing the bonded first of the carbon nano-substance layers by etching the separated metal layer, forming one of the silicon carbide layers on the exposed first of the carbon nano-substance layers, and forming a second of the carbon nano-substance layers on the formed one of the silicon carbide layers.

10. The method of claim 9, wherein the forming of the first of the carbon nano-substance layers and the forming of the second of the carbon nano-substance layers comprise mounting the base substrate within a quartz tube, heating the mounted base substrate, depositing carbon nano-substance by injecting a reactive gas mixture comprising a carbon component into the quartz tube, and cooling the deposited carbon nano-substance.

11. The method of claim 8, wherein the forming of the structure comprises forming a metal layer on a base substrate, forming a first of the silicon carbide layers on the formed metal layer, separating the formed metal layer and the formed first of the silicon carbide layers from the base substrate, bonding the separated first of the silicon carbide layers to the formed sacrificial layer, exposing the bonded first of the silicon carbide layers by etching the separated metal layer, forming one of the carbon nano-substance layers on the exposed first of the silicon carbide layers, and forming a second of the silicon carbide layers on the formed one of the carbon nano-substance layers.

12. The method of claim 8, wherein the carbon nano-substance layers comprise graphene, graphite, a Carbon Nano Tube (CNT), or any combination thereof.

13. A method of manufacturing a resonator, the method comprising:
    forming a sacrificial layer on a substrate; and
    forming a resonant structure on the sacrificial layer, the resonant structure comprising three layers comprising one or more carbon nano-substance layers and one or more silicon carbide layers.

14. The method of claim 13, wherein the forming of the sacrificial layer comprises enabling a region of the resonant structure to be spaced apart from the substrate.

15. The method of claim 13, wherein the forming of the resonant structure comprises symmetrically structuring the three layers with respect to a center portion of the resonant structure in a vertical direction, the symmetrical structuring of the three layers comprising forming a first of the carbon nano-substance layers on the sacrificial layer, forming one of the silicon carbide layers on the formed first of the carbon nano-substance layers, and forming a second of the carbon nano-substance layers on the formed one of the silicon carbide layers.

16. The method of claim 13, wherein the forming of the resonant structure comprises symmetrically structuring the three layers with respect to a center portion of the resonant structure in a vertical direction, the symmetrical structuring of the three layers comprising forming a first of the silicon carbide layers on the sacrificial layer, forming one of the carbon nano-substance layers on the formed first of the silicon carbide layers, and forming a second of the silicon carbide layers on the formed one of the carbon nano-substance layers.

17. The method of claim 13, wherein the carbon nano-substance layers comprise graphene, graphite, a Carbon Nano Tube (CNT), or any combination thereof.

18. The method of claim 13, wherein the silicon carbide layers comprise a thin film deposit.

19. The method of claim 13, wherein the forming of the resonant structure comprises symmetrically structuring the three layers with respect to a center portion of the resonant structure in a horizontal direction, the symmetrical structuring of the three layers comprising forming a first of the carbon nano-substance layers on the sacrificial layers, forming one of the silicon carbide layers on the formed first of the carbon nano-substance layers, and forming a second of the carbon nano-substance layers on the formed one of the silicon carbide layers.

20. The method of claim 13, wherein the forming of the resonant structure comprises symmetrically structuring the three layers with respect to a center portion of the resonant structure in a horizontal direction, the symmetrical structuring of the three comprising forming a first of the silicon carbide layers on the sacrificial layer forming one of the carbon nano-substance layers on the formed first of the silicon carbide layers, and forming a second of the silicon carbide layers on the formed one of the carbon nano-substance layers.

* * * * *